(12) United States Patent
Andreev et al.

(10) Patent No.: US 7,430,694 B2
(45) Date of Patent: Sep. 30, 2008

(54) MEMORY BISR ARCHITECTURE FOR A SLICE

(75) Inventors: Alexander E. Andreev, San Jose, CA (US); Sergey V. Gribok, Santa Clara, CA (US); Anatoli A. Bolotov, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 791 days.

(21) Appl. No.: 11/038,698

(22) Filed: Jan. 20, 2005

(65) Prior Publication Data

US 2006/0161803 A1  Jul. 20, 2006

(51) Int. Cl.
*G11C 29/00* (2006.01)
*G06F 12/00* (2006.01)

(52) U.S. Cl. .................... 714/718; 711/202
(58) Field of Classification Search .............. None
See application file for complete search history.

(56) References Cited

U.S. PATENT DOCUMENTS

| | | | | |
|---|---|---|---|---|
| 5,901,095 A | * | 5/1999 | Crafts | 365/200 |
| 6,687,805 B1 | * | 2/2004 | Cochran | 711/209 |
| 7,062,689 B2 | * | 6/2006 | Slobodnik | 714/718 |

* cited by examiner

*Primary Examiner*—Christine T Tu
(74) *Attorney, Agent, or Firm*—Suiter Swantz PC LLO

(57) ABSTRACT

The present invention provides a memory BISR architecture for a slice. The architecture includes (1) a plurality of physical memory instances; (2) a Mem_BIST controller, communicatively coupled to the plurality of physical memory instances, for testing the plurality of physical memory instances; (3) a FLARE module, communicatively coupled to the Mem_BIST controller, including a scan chain of registers for storing test results of the plurality of physical memory instances, each of the plurality of physical memory instances $M\_i$ being assigned one FLARE bit $f\_i$, $i=1, 2, \ldots, n$, the FLARE module being used by the Mem_BIST controller to scan in an error vector $F=(f\_1, f\_2, \ldots, f\_n)$; (4) a BISR controller, communicatively coupled to the FLARE module, a ROM module and a REPAIR_CONFIGURATION module, for scanning out the error vector F from the FLARE module to computer a repair configuration vector $R=(r\_1, r\_2, \ldots, r\_n)$; and (5) a FUSE module, communicatively coupled to the BISR controller and the REPAIR_CONFIGURATION module, for storing the repair configuration vector R. The REPAIR_CONFIGURATION module, communicatively coupled to the plurality of physical memory instances $M\_i$ and an integrated circuit design D, includes switch module instances S for switching among the plurality of physical memory instances in accordance with the repair configuration vector R. The ROM module stores a vector U indicating usage of the plurality of physical memory instances $M\_i$ by the integrated circuit design D.

20 Claims, 4 Drawing Sheets

FIG. 1 ( ● denotes MUX )
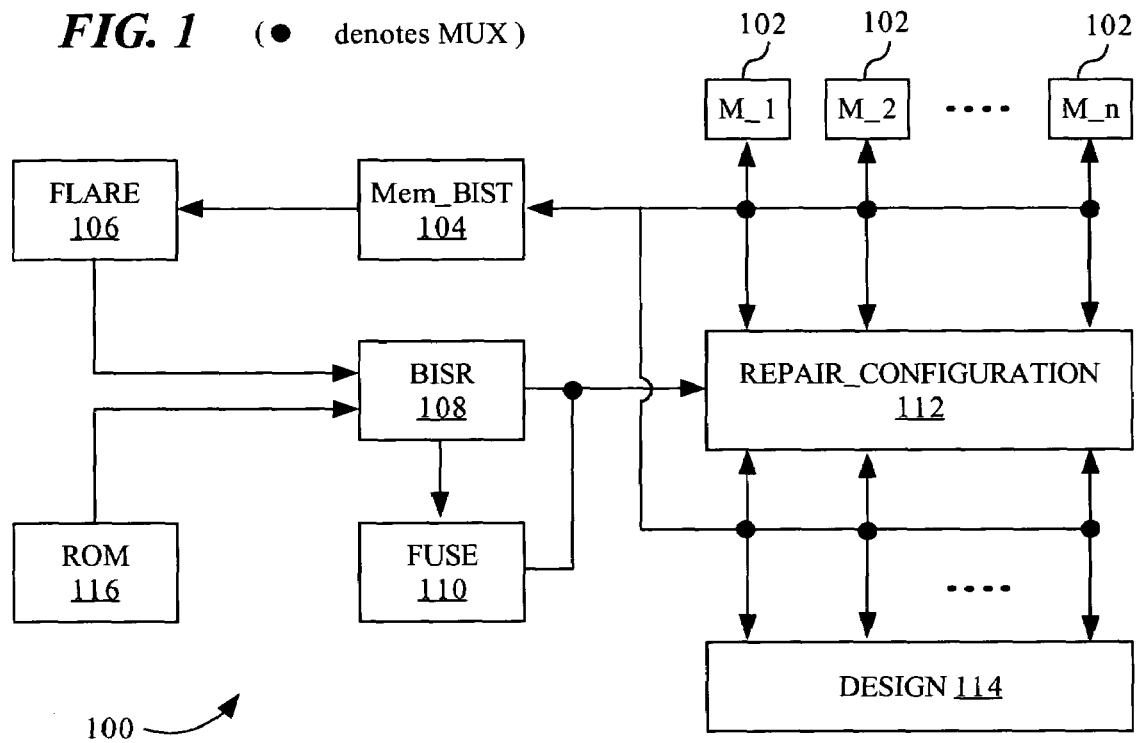
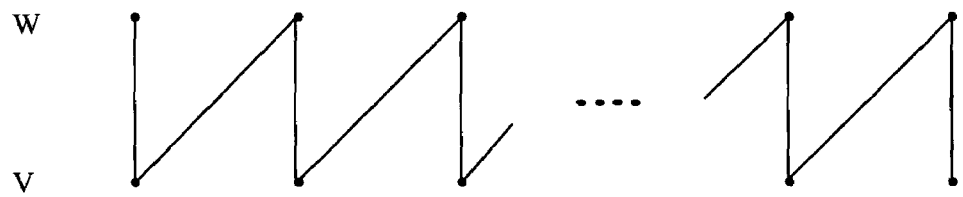
FIG. 2
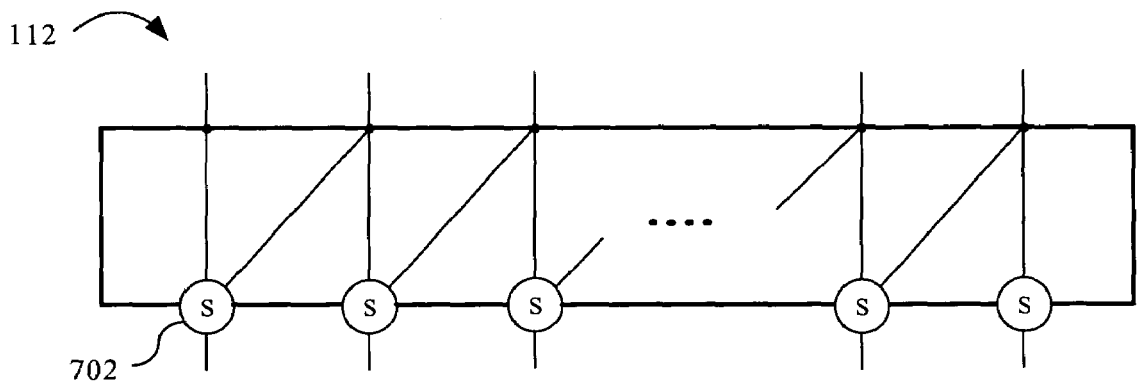
FIG. 7

MEMORY BISR ARCHITECTURE FOR A SLICE

CROSS-REFERENCE TO RELATED DOCUMENTS

The present application incorporates U.S. patent application Ser. No. 10/999,493, filed Nov. 30, 2004, entitled "Method and BIST Architecture for Fast Memory Testing in Platform-Based Integrated Circuit" by reference in its entirety.

FIELD OF THE INVENTION

The present invention generally relates to the field of integrated circuits, particularly to a memory Built-In Self Repair (BISR) architecture for a slice.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduced design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

At the stage of synthesis for VLSI (Very Large-Scale Integration) designs, it is well known that, due to their dense layout, memories typically have a much higher defect density and thus much higher impact on the total yield than other logic. An IC design may be totally unmanufacturable just because a single memory in a slice is defective in a large number of dies. One solution is to provide a memory self repairing method built into the chip. However, conventional BISR solutions are unacceptable for the platform-based IC design because they require insertion of redundant rows and/or redundant columns into memories, and insertion of a large amount of additional logic into memories themselves or into their collars.

Thus, to overcoming the shortcomings of the conventional BISR solutions, it is desirable to provide a new memory Built-In Self Repair (BISR) architecture for a slice.

SUMMARY OF THE INVENTION

In an exemplary aspect, the present invention provides a method for providing soft BISR of memories for a slice. Logic memories of an integrated circuit design D are mapped to a set of physical memories of a slice. A vector U indicating usage of the set of physical memories by the integrated circuit design D is obtained. The vector U is stored in a ROM module. On every power up of the slice, Mem-BIST controller tests are sequentially run on the set of physical memories. Test results of the Mem-BIST controller tests are accumulated in an error vector F. The error vector F is stored in a scan chain module FLARE. For the vector U and the error vector F, a repair configuration vector R is computed. The repair configuration vector R is suitable for switches S to establish a connection between the logic memories and the set of physical memories by means of a REPAIR_CONFIGURATION module. The repair configuration vector R is read from the module FLARE and uploaded to the REPAIR_CONFIGURATION module to establish the connection between the logic memories and the set of physical memories.

In an additional exemplary aspect, the present invention provides a method for providing hard BISR of memories for a slice. Logic memories of an integrated circuit design D are mapped to a set of physical memories of a slice. A vector U indicating usage of the set of physical memories by the integrated circuit design D is obtained. The vector U is stored in a ROM module. Mem-BIST controller tests are sequentially run on the set of physical memories. Test results of the Mem-BIST controller tests are accumulated in an error vector F. The error vector F is stored in a scan chain module FLARE. For the vector U and the error vector F, a repair configuration vector R is computed. The repair configuration vector R is suitable for switches S to establish a connection between the logic memories and the set of physical memories by means of a REPAIR_CONFIGURATION module. The repair configuration vector R is stored in a fuse chain module FUSE by blowing corresponding fuses. On every power up of the slice, the repair configuration vector R is read from the FUSE module and uploaded to the REPAIR_CONFIGURATION module to establish the connection between the logic memories and the set of physical memories.

In another exemplary aspect, the present invention provides a memory BISR architecture for a slice. The architecture includes (1) a plurality of physical memory instances; (2) a Mem_BIST controller, communicatively coupled to the plurality of physical memory instances, for testing the plurality of physical memory instances; (3) a FLARE module, communicatively coupled to the Mem_BIST controller, including a scan chain of registers for storing test results of the plurality of physical memory instances, each of the plurality of physical memory instances M_i being assigned one FLARE bit f_i, i=1, 2, . . . , n, the FLARE module being used by the Mem_BIST controller to scan in an error vector F=(f_1, f_2, . . . , f_n); (4) a BISR controller, communicatively coupled to the FLARE module, a ROM module and a REPAIR_CONFIGURATION module, for scanning out the error vector F from the FLARE module to computer a repair configuration vector R=(r_1, r_2, . . . , r_n); and (5) a FUSE module, communicatively coupled to the BISR controller and the REPAIR_CONFIGURATION module, for storing the repair configuration vector R. The REPAIR_CONFIGURATION module, communicatively coupled to the plurality of physical memory instances M_i and an integrated circuit design D, includes switch module instances S for switching among the plurality of physical memory instances in accordance with the repair configuration vector R. The ROM module stores a vector U indicating usage of the plurality of physical memory instances M_i by the integrated circuit design D.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram illustrating a memory BISR architecture for a slice in accordance with an exemplary embodiment of the present invention;

FIG. 2 is a schematic diagram illustrating an exemplary bipartive graph B_n;

FIG. 7 shows an embodiment of the REPAIR_CONFIGURATION module shown in FIG. 1 in accordance with an exemplary embodiment of the present invention;

DETAILED DESCRIPTION OF THE INVENTION

Figure 3:
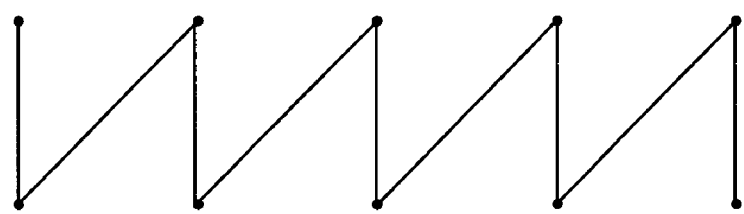
FIG. 3 is a schematic diagram illustrating an exemplary bipartive graph B_5.

Reference will now be made in detail to the presently preferred embodiments of the invention, examples of which are illustrated in the accompanying drawings.

The present invention provides a BISR architecture for testing memories prediffused in a slice with self-repairing of memories in a customer's designs. The present invention utilizes redundant memories available on slice, which are not used in a given IC design, to implement self-repairing of memories.

In a platform-based IC (such as RapidChip™, RapidSlice™), there are often tens or even hundreds of memories on a chip, and a straightforward way of placing BISR controllers for each memory instance may result in an unwanted increase in chip area size. On the other hand, in platform-based IC technology, there are also multiple instances of the same memory module and not all of them are used in a given IC design. Therefore, the present invention uses unused memory instances for BISR purpose by treating them as redundant memory instances. The present invention uses a BISR controller to make reconfigurable connection with memory instances in the slice, which allows swapping among memory instances. Thus, each memory has one or more possible substitute memory instances: when instance 1 fails, instance 2 is a replacement candidate; when instance 2 fails, instance 3 is a replacement candidate, and so on. The present invention provides self-switching between memory instances in a slice in the case of a memory instance failure. It is understood that by increasing the number of possible candidates for replacement from 1 to k, one may perform more comprehensive repair (e.g., to REPAIR ANY K MEMORY INSTANCE FAILURES IN A DESIGN).

A. BISR Architecture for Slice

FIG. 1 is a schematic diagram illustrating a memory BISR architecture 100 for a slice in accordance with an exemplary embodiment of the present invention. Built in Self Repair (BISR) is a technique which allows repairing of embedded memories on a chip. As shown, a slice may include a set of prediffused instances M_1, M_2, . . . , M_n 102 of a RAM base memory module M. For a given IC design D 114, a characteristic vector U=(u_1, u_2, . . . , u_n) may be obtained, which may determine which of the memory instances 102 is used and which is not used by the design D 114. For example, u_i=1 (or 0) may designate that the corresponding memory instance M_i is used (or not used) by the design D. The vector U may be obtained while mapping memories from the design D 114 to the set of standard memory instances available in the slice, i.e, to the set M_1, M_2, . . . , M_n 102. The vector U may be stored in a ROM module 116 and may be read from there when necessary. It is understood that the vector U depends on the way of mapping the design memories (logic memories) into slice memories and does not vary for a given design D.

Repair itself may be performed by establishing a reconfigurable connection between memories from an IC design (i.e., logical memories) and memory instances on the slice (i.e., physical memories). Each logical memory of the IC design may be connected with 2 possible physical memories M_i and M_(i+1) in the slice. If instance M_i fails, then instance M_(i+1) is a replacement candidate. The more logical memories unused, the greater the probability that all replacements (caused by physical memory errors) can be successfully implemented (and, thus, all memory errors may be repaired in the chip). The actual switching between (or swapping of) physical memories M_i and M_(i+1) is performed with a switch module instance S under the control of a configuration bit from a repair configuration vector R, which will be described in detail later.

Memory Built-In Self Testing (Mem_BIST) controller 104 provides a method of testing physical memories 102 in the slice. The Mem_BIST controller 104 may be integrated within BISR (e.g., in RapidChip™). The Mem_BIST controller 104 tests all physical memories (e.g., instances $M\_1, M\_2, \ldots, M\_n$) in the slice whether the physical memories are related to the design D 114. The Mem_BIST controller 104 has a dual interface corresponding to memory input and output ports, and performs a sequence of the test read and write operations according to one or another implemented test algorithm. The test may be a data path test, a retention data test, a bit read and write test, an address decoder test or the like, or any combination of them. All physical memories are tested sequentially via pipelined test bus. This allows speed testing and does not require the Mem_BIST controller 104 to be placed close to the memory under the test.

FLARE module 106 includes a scan chain of registers for storing or accumulating test results of the Mem_BIST controller test. Each physical memory $M\_i$ is assigned one FLARE bit $f\_i$. This assignment does not vary for a given slice. FLARE scan chain is used by the Mem_BIST controller 104 to scan in an error vector $F=(f\_1, f\_2, \ldots, f\_n)$, where $f\_i=1$ designates that the physical memory $M\_i$ failed during its testing, $i=1, 2, n$. This error vector F is scanned out from the FLARE module 106 by a BISR controller module 108 to compute a repair configuration vector R. Preferably, the repair configuration vector R is computed using bipartive graph technique (see below for detail). It is understood that the error vector F essentially depends on a given die and may vary even on every power up of the chip.

FUSE module 110 includes a chain of fuse elements along with associated logic to read the chain of fuse elements. Each fuse element is a metal fuse capable of representing a constant value 0 or 1, depending on whether the fuse has been blown by a laser. Similarly to the FLARE module 106, each physical memory $M\_i$ is assigned one FUSE bit. The FUSE module 106 provides bits in the same order as the bits are scanned out of the FLARE module 106. The FUSE module 110 stores the repair configuration vector R, which may be scanned out by the BISR controller module 108 the same way as the error vector F may be scanned out of the FLARE module 106.

Figure 8:
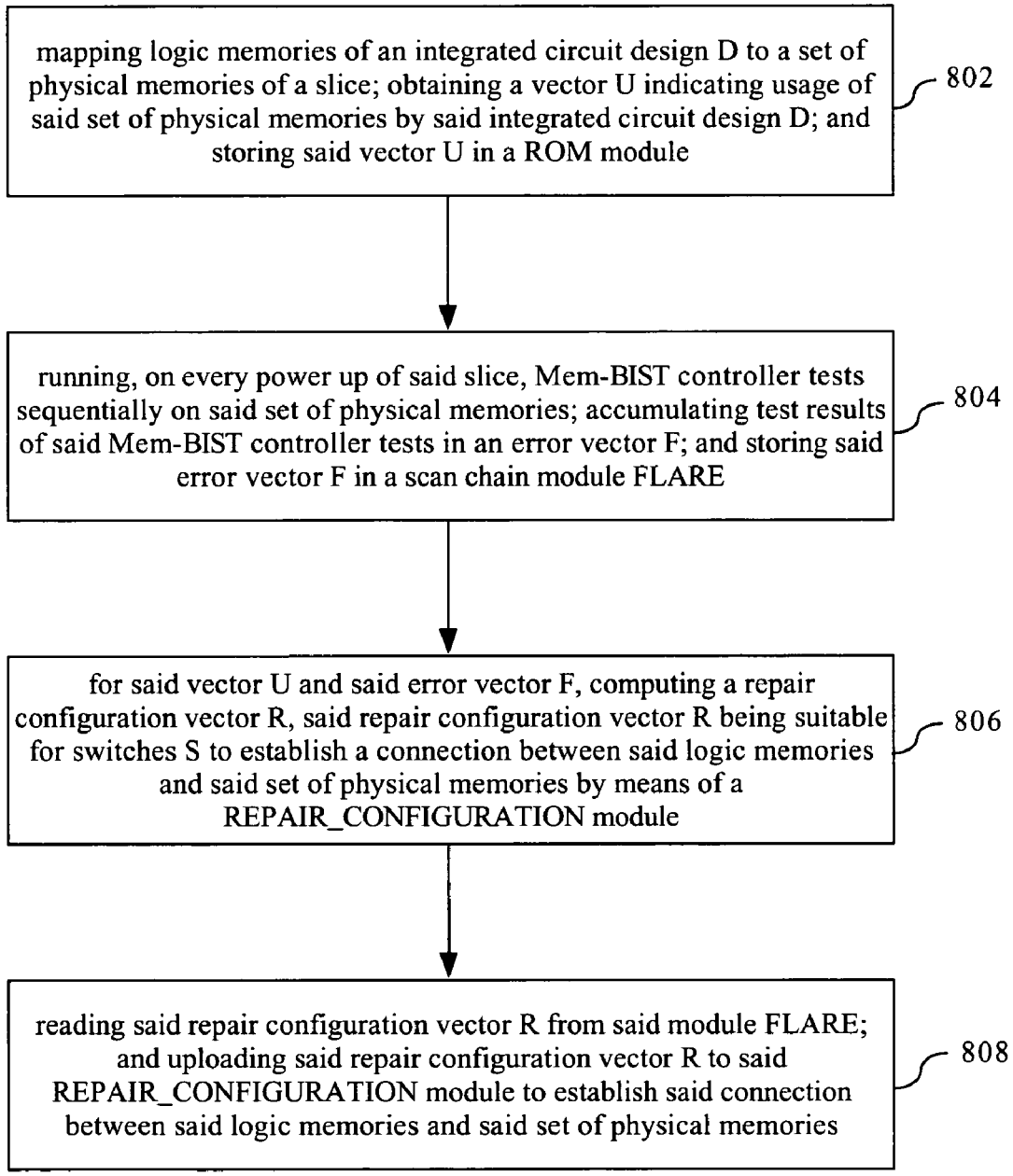
FIG. 8 is a flow diagram of a method for providing soft BISR of memories for a slice in accordance with an exemplary embodiment of the present invention.

In soft BISR, Mem_BIST controller testing may be implemented in a chip during every power up of the chip. Then, a repair configuration vector R may be computed and loaded up into a REPAIR_CONFIGURATION module (which will be described in detail later) on the fly. This may result in a delay of several millions of clock cycles. However, this may repair memories automatically if they fail during the chip usage life unless the chip become un-repairable. In this case of soft BISR, a FUSE module does not need to be placed on the chip since a repair configuration vector is retrieved each time the chip is powered up. FIG. 8 is a flow diagram of a method 800 for providing soft BISR of memories for a slice in accordance with an exemplary embodiment of the present invention. At step 802, logic memories of an integrated circuit design D are mapped to a set of physical memories of a slice, a vector U indicating usage of the set of physical memories by the integrated circuit design D is obtained, and the vector U is stored in a ROM module. The step 802 may be implemented in an IC design center. At step 804, on every power up of the slice, Mem-BIST controller tests are sequentially run on the set of physical memories, test results of the Mem-BIST controller tests are accumulated in an error vector F, and the error vector F is stored in a scan chain module FLARE. The step 804 may be implemented in the field. At step 806, for the vector U and the error vector F, a repair configuration vector R is computed, where the repair configuration vector R is suitable for switches S to establish a connection between the logic memories and the set of physical memories by means of a REPAIR_CONFIGURATION module. The step 806 may be implemented in the field. At step 808, the repair configuration vector R is read from the module FLARE and uploaded to the REPAIR_CONFIGURATION module to establish the connection between the logic memories and the set of physical memories. The step 808 may be implemented in the field.

Figure 9:
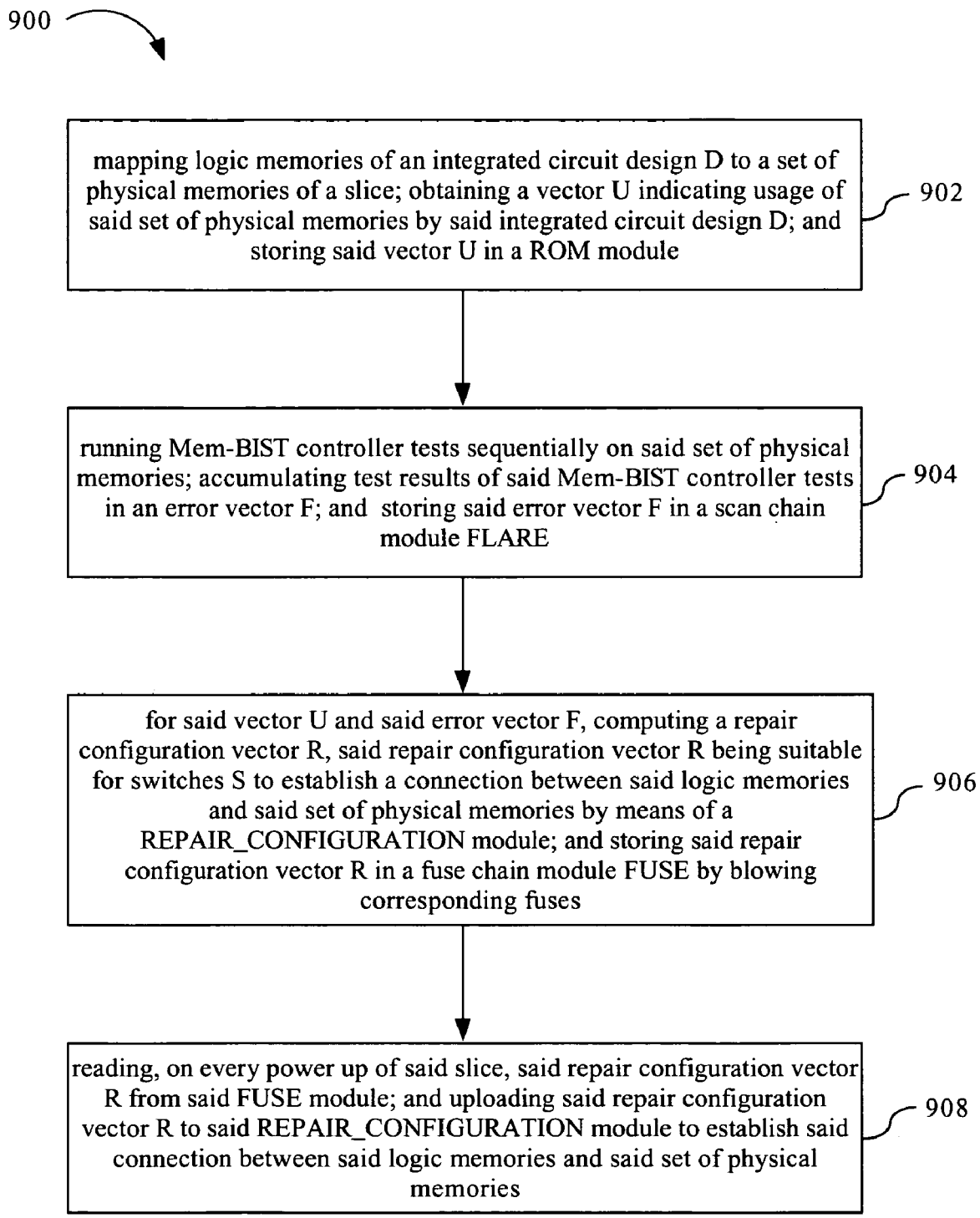
FIG. 9 is a flow diagram of a method for providing hard BISR of memories for a slice in accordance with an exemplary embodiment of the present invention.

In hard BISR, Mem_BIST testing may be performed on a chip in a factory to determine an error vector F and to compute and output a repair configuration vector R for the chip during wafer sort. This vector R may be stored by blowing (in the factory) fuses in the chip and then may be loaded up during every power up of the chip, resulting in a delay of a few hundreds of clock cycles only. It is understood that in this hard BISR, it is assumed that used physical memories remain operable during chip usage life (since wafer sort time). FIG. 9 is a flow diagram of a method 900 for providing hard BISR of memories for a slice in accordance with an exemplary embodiment of the present invention. At step 902, logic memories of an integrated circuit design D are mapped to a set of physical memories of a slice, a vector U indicating usage of the set of physical memories by the integrated circuit design D is obtained, and the vector U is stored in a ROM module. The step 902 may be implemented in an IC design center. At step 904, Mem-BIST controller tests are sequentially run on the set of physical memories, test results of the Mem-BIST controller tests are accumulated in an error vector F, and the error vector F is stored in a scan chain module FLARE. The step 904 may be implemented in a factory. At step 906, for the vector U and the error vector F, a repair configuration vector R is computed, where the repair configuration vector R is suitable for switches S to establish a connection between the logic memories and the set of physical memories by means of a REPAIR_CONFIGURATION module, and the repair configuration vector R is stored in a fuse chain module FUSE by blowing corresponding fuses. The step 906 may be implemented in a factory. At step 908, on every power up of the slice, the repair configuration vector R is read from the FUSE module and uploaded to the REPAIR_CONFIGURATION module to establish the connection between the logic memories and the set of physical memories. The step 908 may be implemented in the field.

B. BISR Method

I. Bipartite Graph $B\_n(F,U)$ and Perfect Matching

The present invention utilizes a bipartite graph $B\_n$ of the form depicted in FIG. 2, where $V=\{v\_1, v\_2, \ldots, v\_n\}$ and $W=\{w\_1, w\_2, \ldots, w\_n\}$ along with two additional given vectors $F=(f\_1, f\_2, \ldots, f\_n)$ and $U=(u\_1, u\_2, \ldots, u\_n)$ which generate a subgraph in $B\_n$. The vectors F (a characteristic error vector of failed physical memories) and U (a characteristic vector of used logical memories) extract two subsets of graph vertices $V(U)=\{v\_i | u\_i=1\}$ and $W(F)=\{w\_i | f\_i=1\}$, which, in turn, determine subgraph $B\_n$ (F,U) generated by these two subsets of vertices.

Figure 4:
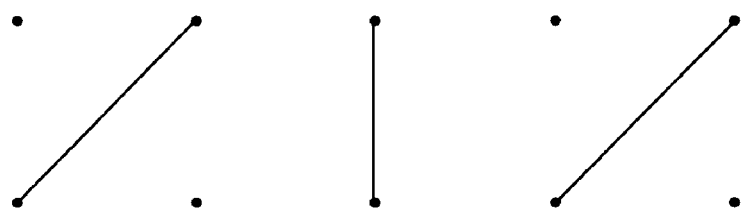
FIG. 4 is a schematic diagram illustrating a bipartive subgraph B_5(F,U) generated by the bipartive graph B_5 shown in FIG. 3 when U=(1,0,1,1,0) and F=(0,1,1,0,1)
Figure 5:
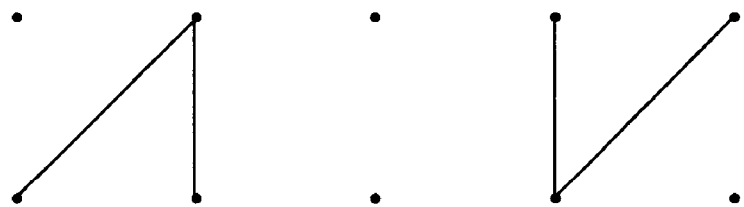
FIG. 5 is a schematic diagram illustrating a bipartive subgraph B_5(F,U) generated by the bipartive graph B_5 shown in FIG. 3 when U=(1,1,0,1,0) and F=(0,1,0,1,1)
Figure 6:
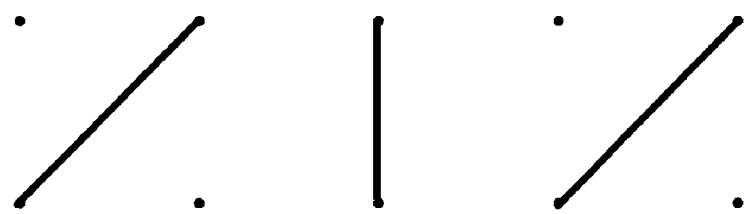
FIG. 6 is a schematic diagram illustrating a perfect matching in the bipartive subgraph B_5(F,U) shown in FIG. 4.

For example, for the bipartite graph $B\_5$ depicted in FIG. 3, for $U=(1, 0, 1, 1, 0)$ and $F=(0, 1, 1, 0, 1)$, a subgraph $B\_5(F,U)$ depicted in FIG. 4 may be obtained; for $U=(1, 1, 0, 1, 0)$ and $F=(0, 1, 0, 1, 1)$, a subgraph $B\_5(F,U)$ depicted in FIG. 5 may be obtained. One may be interested in finding a perfect matching in $B\_n(F,U)$, i.e., to find a set of pairwise nonadjacent edges in it that covers all vertices from V(U). As is common, one may mark in figures the edges from a matching with bold lines. For example, the bipartite graph depicted in FIG. 4 has a perfect matching as depicted in FIG. 6 with bold lines, while the bipartite graph depicted in FIG. 5 has no perfect matching.

For BISR, a perfect matching in $B\_n(F,U)$ may provide the assignment of logical memories from a given IC design to a pre-tested non-failed physical memories on the slice. No perfect matching in B_n(F,U) means that a given chip is non-repairable by the present method. It is understood that as a straightforward generalization of the present BISR method, one may use a bipartite graph B_n_k similar to B_n but with k edges adjusted to each vertex (excluding several last vertices) instead of two edges of the present method, resulting in a more powerful repair capability (for instance, it may be capable of repairing any k failed memories in the slice).

A perfect matching in B_n(F,U) may be encoded as follows. Two edges adjusted to the vertex v from V(U) are distinguished and referred to as a vertical edge and an inclined edge. For a given perfect matching, its code will be a vector R=(r_1, r_2, ..., r_n), where r_i=1 if vertex v_i from V(U) is adjusted to an inclined edge in the perfect matching, r_i=0 if it is adjusted to a vertical edge in the matching, and, finally, r_i=x (don't care value) if the vertex is not from V(U).

The vector R constitutes repair information for making repairs on the chip. In order to find the repair configuration vector R, one may construct a perfect matching in B_n(F,U). In the case of a bipartite graph B_n(F,U), it may be implemented much more easier than in the case of a general bipartite graph by means of the following linear algorithm.

One may pass all vertices v_1, v_2, ..., v_n in the order from the left to the right. For the vertex v_i from V(U), one may include edge e_(2i−1)=(v_i, w_i) in the current matching if the edge e_(2i−2) has not been added to the matching at the previous step; otherwise, one may include into the matching the next edge e_2i=(v_i, w_(i+1)) if it is an edge in the subgraph B_n(F,U) (i.e. w_(i+1) from W(F)) (otherwise, one may stop and report no perfect matching in B_n(F,U)).

It is understood that this algorithm runs sequentially. For two given input bits f_i and u_i and a previous carry c (which simply indicates whether it took vertical or inclined edge at the previous step), the algorithm computes which of the two edges of vertex v_i to take: vertical one if possible; if not, an inclined one; and, finally, if it is impossible to take either one ("overloading" case), then the algorithm reports that there is no perfect matching in the graph. It is understood that if the present algorithm cannot find a perfect matching, then there is really no perfect matching in the graph.

Applying the foregoing-described algorithm to the graph B-5(F,U) depicted in FIG. 4 may construct the perfect matching depicted in FIG. 6 and thus compute the repair configuration vector R=(1, x, 0, 1, x).

II. REPAIR_CONFIGURATION Module

Referring back to FIG. 1, the REPAIR_CONFIGURATION module 112 is a main module which implements repair. FIG. 7 shows an embodiment of the REPAIR_CONFIGURATION module 112 shown in FIG. 1 in accordance with an exemplary embodiment of the present invention, where S indicates SWITCH modules 702, which switch input-output memory buses according to bit r_i of the repair configuration vector R computed as the code of the perfect matching found in the bipartite subgraph B_n(F,U). That is, in the case r_i=0, the SWITCH modules 702 establish a vertical connection between input-output buses of a corresponding logical memory M of the design D and physical memory M_i of the slice; and in the case r_i=1, the SWITCH modules 702 implement an inclined connection with a next physical memory M(i+1).

When repair is finished (i.e., when all connections in the RAPAIR_CONFIGURATION module are set), then one may run Mem-BIST controller tests for the second round of tests. This time testing memories may be implemented through input-output memory buses passing through the REPAIR_CONFIGURATION module, thereby ensuring that repair is performed properly and all logical memories in the design pass the test.

When there is no perfect matching in the bipartite subgraph B_n(F,U), then the chip is non-repairable.

The present invention may provide the following advantages. First, the present BISR architecture may increase yield and speed up memory testing. In addition, the present invention may improve timing and reduce the die size. Moreover, the present BISR architecture may test memories remotely located on a chip. Further, the present architecture is easy to implement. Additionally, the present invention may test multiple instances of the same memory type with a single controller. Further, the present invention provides BISR flexibility, supports hard and soft BISR, and is easy to implement in platform-based ICs. Moreover, the present invention allows Mem_BIST flexibility and provides easy extension of required memory tests.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for providing soft BISR of memories for a slice, comprising:
  mapping logic memories of an integrated circuit design D to a set of physical memories of a slice;
  obtaining a vector U indicating usage of said set of physical memories by said integrated circuit design D; and
  storing said vector U in a ROM module.

2. The method of claim 1, further comprises:
  running, on every power up of said slice, Mem-BIST controller tests sequentially on said set of physical memories;
  accumulating test results of said Mem-BIST controller tests in an error vector F; and
  storing said error vector F in a scan chain module FLARE.

3. The method of claim 2, further comprises:
  for said vector U and said error vector F, computing a repair configuration vector R, said repair configuration vector R being suitable for switches S to establish a connection between said logic memories and said set of physical memories by means of a REPAIR_CONFIGURATION module.

4. The method of claim 3, wherein said repair configuration vector R is computed using bipartive graph technique.

5. The method of claim 3, further comprises:
  reading said repair configuration vector R from said module FLARE; and uploading said repair configuration vector R to said REPAIR_CONFIGURATION module to establish said connection between said logic memories and said set of physical memories.

6. A method for providing hard BISR of memories for a slice, comprising:
mapping logic memories of an integrated circuit design D to a set of physical memories of a slice;
obtaining a vector U indicating usage of said set of physical memories by said integrated circuit design D; and
storing said vector U in a ROM module.

7. The method of claim 6, further comprises:
running Mem-BIST controller tests sequentially on said set of physical memories;
accumulating test results of said Mem-BIST controller tests in an error vector F; and
storing said error vector F in a scan chain module FLARE.

8. The method of claim 7, further comprises:
for said vector U and said error vector F, computing a repair configuration vector R, said repair configuration vector R being suitable for switches S to establish a connection between said logic memories and said set of physical memories by means of a REPAIR_CONFIGURATION module; and
storing said repair configuration vector R in a fuse chain module FUSE by blowing corresponding fuses.

9. The method of claim 8, wherein said repair configuration vector R is computed using bipartive graph technique.

10. The method of claim 8, further comprises:
reading, on every power up of said slice, said repair configuration vector R from said FUSE module; and
uploading said repair configuration vector R to said REPAIR_CONFIGURATION module to establish said connection between said logic memories and said set of physical memories.

11. A memory BISR architecture for a slice, comprising:
a plurality of physical memory instances;
a Mem_BIST controller, communicatively coupled to said plurality of physical memory instances, for testing said plurality of physical memory instances;
a FLARE module, communicatively coupled to said Mem_BIST controller, including a scan chain of registers for storing test results of said plurality of physical memory instances, each of said plurality of physical memory instances $M\_i$ being assigned one FLARE bit $f\_i$, $i=1, 2, \ldots, n$, said FLARE module being used by said Mem_BIST controller to scan in an error vector $F=(f\_1, f\_2, \ldots, f\_n)$;
a BISR controller, communicatively coupled to said FLARE module, a ROM module and a REPAIR_CONFIGURATION module, for scanning out said error vector F from said FLARE module to compute a repair configuration vector $R=(r\_1, r\_2, \ldots, r\_n)$; and
a FUSE module, communicatively coupled to said BISR controller and said REPAIR_CONFIGURATION module, for storing said repair configuration vector R,
wherein said REPAIR_CONFIGURATION module, communicatively coupled to said plurality of physical memory instances $M\_i$ and an integrated circuit design D, includes switch module instances S for switching among said plurality of physical memory instances in accordance with said repair configuration vector R, and
wherein said ROM module stores a vector U indicating usage of said plurality of physical memory instances $M\_i$ by said integrated circuit design D.

12. The memory BISR architecture of claim 11, wherein said FLARE bit $f\_i=1$ indicates said physical memory instances $M\_i$ has failed testing.

13. The memory BISR architecture of claim 11, wherein said error vector may vary on every power up of said slice.

14. The memory BISR architecture of claim 11, wherein said FUSE module includes a chain of fuse elements and associated logic to read said chain of fuse elements.

15. The memory BISR architecture of claim 14, wherein each of said chain of fuse elements is a metal fuse capable of representing a constant value 0 or 1 depending on whether said each of said chain of fuse elements has been blown by a laser.

16. The memory BISR architecture of claim 11, wherein said repair configuration vector R is computed using bipartive graph technique.

17. The memory BISR architecture of claim 16, wherein said vector U and said error vector F are used to generate a bipartive graph $B\_n(F,U)$.

18. The memory BISR architecture of claim 17, wherein a perfect matching in said bipartive graph $B\_n(F,U)$ provides assignment of logic memories of said integrated circuit design D to said plurality of physical memory instances.

19. The memory BISR architecture of claim 17, wherein no perfect matching in said bipartive graph $B\_n(F,U)$ indicates that said slice is non-repairable.

20. The memory BISR architecture of claim 11, wherein said switch module instances S switch input-output memory buses according to bit $r\_i$ of said repair configuration vector R.

* * * * *